United States Patent [19]

Milsom

[11] Patent Number: 4,727,275
[45] Date of Patent: Feb. 23, 1988

[54] ACOUSTIC SURFACE WAVE DEVICE

[75] Inventor: Robert F. Milsom, Redhill, England

[73] Assignee: U.S. Philips Corporation, New York, N.Y.

[21] Appl. No.: 641,644

[22] Filed: Aug. 17, 1984

[30] Foreign Application Priority Data

Aug. 31, 1983 [GB] United Kingdom ............... 8323294

[51] Int. Cl.⁴ ............................................. H01L 41/08
[52] U.S. Cl. ............................. 310/313 D; 310/313 B; 333/153; 333/154; 333/195
[58] Field of Search ........... 310/313 B, 313 R, 313 D; 333/153, 154, 195

[56] References Cited

U.S. PATENT DOCUMENTS

| | | | |
|---|---|---|---|
| 3,886,504 | 5/1975 | Hartmann et al. | 310/313 D |
| 4,038,614 | 7/1977 | Chapman et al. | 310/313 D |
| 4,079,342 | 3/1978 | Solie | 333/195 |
| 4,126,837 | 11/1978 | Koyamada | 333/195 X |
| 4,130,813 | 12/1978 | Sandy et al. | 310/313 D |
| 4,357,584 | 11/1982 | Murray et al. | 333/195 |
| 4,370,633 | 1/1983 | Schofield | 333/195 |
| 4,425,554 | 1/1984 | Morishita et al. | 310/313 D |
| 4,510,471 | 4/1985 | Flinn et al. | 310/313 D X |
| 4,511,867 | 4/1985 | Schofield | 310/313 D X |

FOREIGN PATENT DOCUMENTS 1551530 8/1979 United Kingdom .

Primary Examiner—Mark O. Budd
Attorney, Agent, or Firm—Robert T. Mayer; Bernard Franzblau

[57] ABSTRACT

A surface acoustic wave device in which the two ports of an input transducer (2) provided on a piezoelectric substrate (1) are coupled to the two ports of an output transducer (3) via respective reflective multi-strip couplers (12, 13). In order to avoid the necessity of providing external tuned matching components to attain the low potential insertion loss of such a device, the number of electrodes and center-to-center distances of the electrodes of at least one of the transducers are chosen so that the impedance of that transducer is substantially real for a range of frequencies which contains the center-frequency of the device response characteristic as determined by the couplers.

7 Claims, 4 Drawing Figures

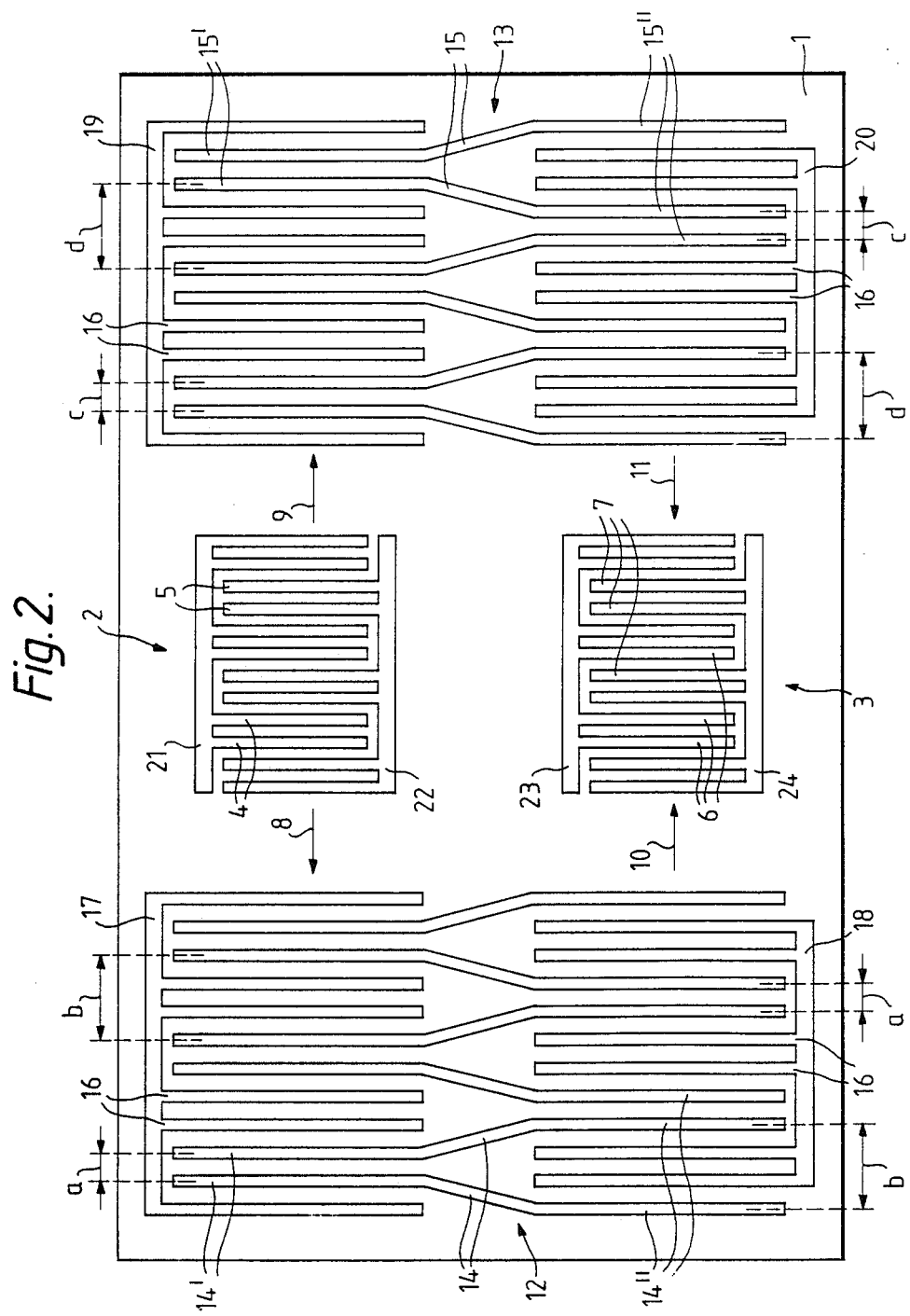

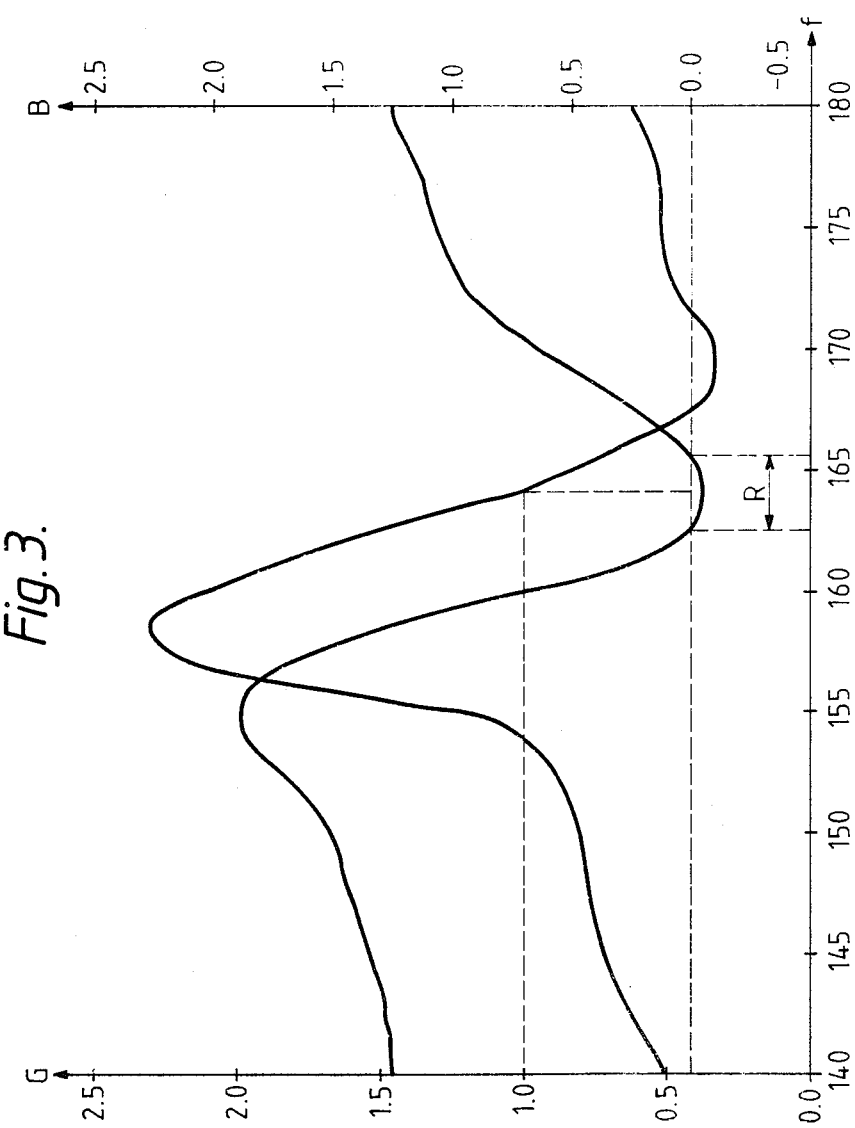

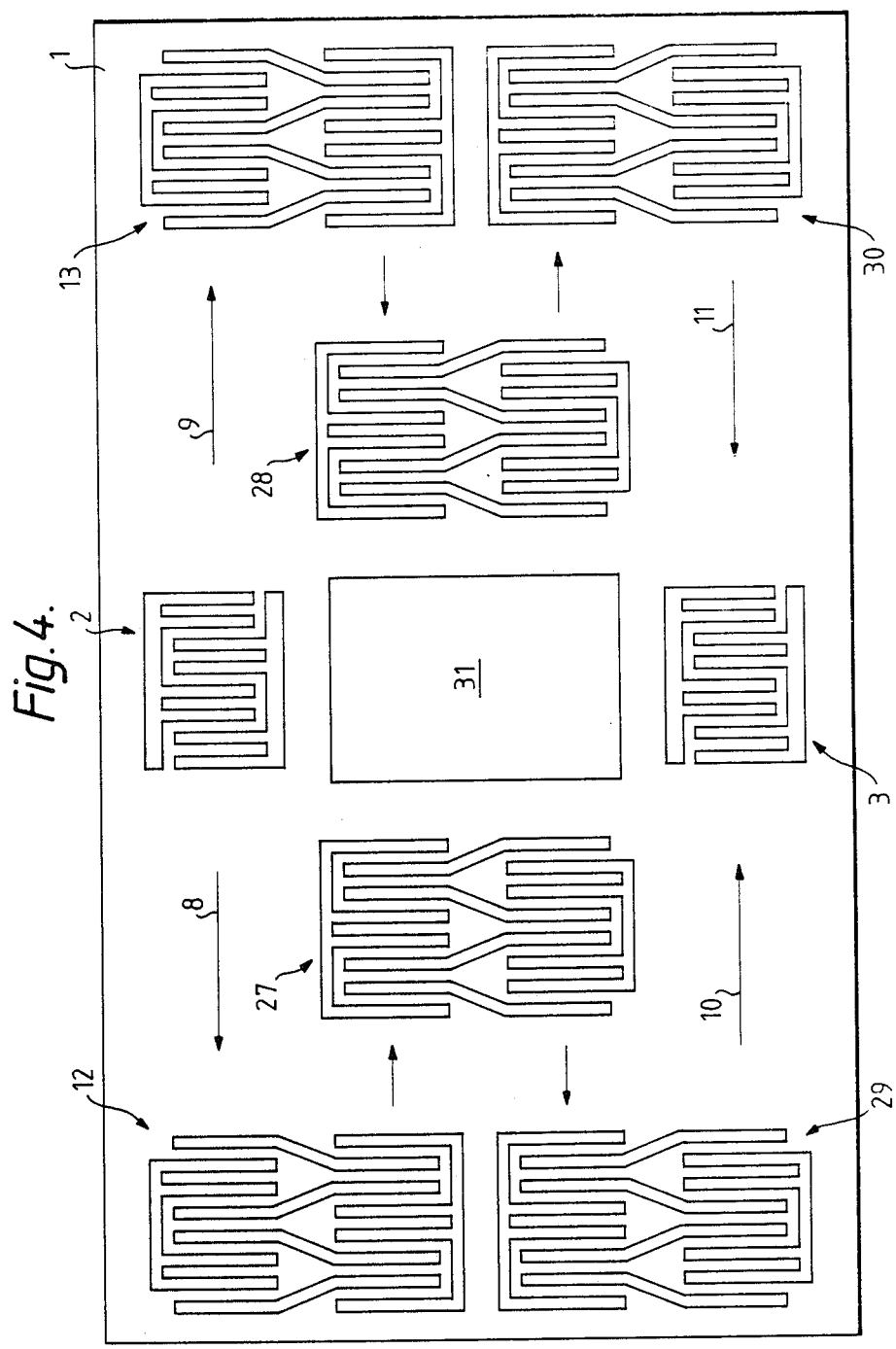

ACOUSTIC SURFACE WAVE DEVICE

This invention relate to an acoustic surface wave device comprising a piezo-electric substrate for propagating acoustic surface waves at a surface thereof, a first bi-directional electro-acoustic transducer formed on said surface for launching acoustic surface waves along first and second propagation paths at said surface, a second bidirectional electro-acoustic transducer formed on said surface for receiving acoustic surface waves propagating along said first and second paths at respective input ports thereof, and at least one pair of reflective multi-strip couplers formed on said surface, the two couplers of the or each pair being associated with said first and second paths respectively for receiving acoustic surface wave energy of a given frequency propagating along a portion of the associated path and relaunching at least part of that energy as acoustic surface waves along another portion of the associated path, said given frequency being the same for each coupler, each transducer comprising an interdigital array of electrodes which extend at right angles to the length directions of the propagation paths where those paths adjoin the relevant transducer.

A device of this kind, which will be referred to as a device of the kind set forth, is known from, for example, FIG. 5 of published French patent application serial number 2290785 and is shown in FIG. 1 of the accompanying diagrammatic drawings.

In FIG. 1 (which is a diagrammatic plan view) an acoustic surface wave device comprises a piezo-electric substrate 1 on the top surface of which are formed first and second transducers 2 and 3 respectively for launching and receiving, respectively, surface acoustic waves at said top surface. Each transducer comprises an interdigital array of electrodes 4, 5 and 6, 7 respectively as shown, an input signal being applied between the two combs which make up the transducer 2 and an output signal being generated between the two combs which make up the transducer 3. Each transducer is bidirectional, i.e. acoustic surface waves are propagated by transducer 2 simultaneously in two oppositely-directed tracks the length directions of which extend at right angles to the electrodes 4 and 5. These tracks are indicated by arrows 8 and 9 respectively. Similarly transducer 3 receives and transduces simultaneously acoustic surfce waves incident thereon from two oppositely directed tracks the length directions of which extend at right angles to the electrodes 6 and 7. These tracks are indicated by arrows 10 and 11 respectively. Tracks 8 and 10 constitute first and second portions respectively of a first surface acoustic wave propagation path from transducer 2 to transducer 3, and tracks 9 and 11 constitute first and second portions respectively of a second surface acoustic wave propagation path from transducer 2 to transducer 3. A pair of reflective multistrip couplers 12 and 13 respectively are also formed on the top surface of substrate 1. Coupler 12 receives surface acoustic wave energy propagating along track 8 and relaunches at least part of that energy along track 10. Similarly, coupler 13 receives surface acoustic wave energy of a given frequency propagating along track 9 and relaunches at least part of that energy along track 11. To this end the portions 14' of the conductive strips 14 of the coupler 12 which extend over and at right angles to the track 8 have a centre-to-centre distance a and the corresponding portions 14" of the strips 14 of the coupler 12 which extend over and at right angles to the track 10 have a different centre-to-centre distance b, where $a+b=\lambda o$. $\lambda o$ is the wavelength of acoustic surface waves which are launched by transducer 2 along tracks 8 and 9 when an electric input signal having a frequency (the "given frequency") equal to the centre-frequency of the desired frequency response characteristic of the device (which operates as a filter) is applied to transducer 2. (For a discussion of this see, for example, the aforementioned French patent specification and also the article entitled "A new multistrip acoustic surface wave filter" by M. Feldmann and J. Henaff in Proc. IEEE Ultrasonics Symposium 1974, pages 157–160.) Similarly the portions 15' of the conductive strips 15 of the coupler 13 which extend over and at right angles to the track 9 have a centre-to-centre distance c and the corresponding portions 15" of the strips 15 of the coupler 13 which extend over and at right-angles to the track 11 have a different centre-to-centre distance d, where again $c+d=\lambda o$. The values of a and c may, for example, equal $\frac{2}{3}\lambda o$, in which case b and d will equal $\frac{1}{3}\lambda o$. If the couplers 12 and 13 contain a sufficient number of strips 14 and 15 respectively, substantially all of the energy launched in both tracks 8 and 9 by transducer 2 will be transferred to tracks 10 and 11 respectively, and hence to transducer 3, enabling the device of FIG. 1 to have a lower insertion loss at the centre frequency than would be the case if the energy launched in one direction by transducer 2 were simply dissipated, for example by means of absorbent material. It can be arranged that, over a limited range of frequencies (approximately 1% if the substrate 1 is 128° Y-rotated X-propagating lithium niobate and approximately 2% if the substrate 1 is 41° Y-rotated X-propagating lithium niobate) almost 100% of the energy propagating in tracks 8 and 9 is transferred to tracks 10 and 11 respectively by couplers 12 and 13 respectively.

This potentially low insertion loss is very useful, for example, when the device is used to provide front-end selectivity in radio or other receivers, but can be achieved only if the transducers are correctly matched to the external circuits to which they are connected in operation. With the known devices this entails the provision of matching networks as external components, which networks may have to be individually tuned, thus adding to the cost of providing the filter. It is an object of the invention to mitigate this disadvantage.

The invention provides an acoustic surface wave device comprising a piezo-electric substrate for propagating acoustic surface waves at a surface thereof, a first bi-directional electro-acoustic transducer formed on said surface for launching acoustic surface waves along first and second propagation paths at said surface, a second bidirectional electro-acoustic transducer formed on said surface for receiving acoustic surface waves propagating along said first and second paths at respective input ports thereof, and at least one pair of reflective multi-strip couplers formed on said surface, the two couplers of the or each pair being associated with said first and second paths respectively for receiving acoustic surface wave energy of a given frequency propagating along a portion of the associated path and relaunching at least part of that energy as acoustic surface waves along another portion of the associated path, said given frequency being the same for each coupler, each transducer comprising an interdigital array of electrodes which extend at right angles to the length directions of the propagation paths where those paths adjoin the relevant transducer, characterized in that the number and centre-to-centre distances of the electrodes in at least one said array are such that the susceptance versus frequency characteristic of the corresponding transducer exhibits a minimum which substantially coincides with said given frequency and the value of the susceptance at this minimum is substantially zero.

It has now been recognised that, because the frequency response characteristic of a device of the kind set forth is determined mainly by the reflective multistrip couplers, there is a considerable amount of latitude available in the design of the transducers. Because of this, and because the susceptance versus frequency characteristic of each transducer exhibits a minimum at a frequency which depends on the centre-to-centre distances and the number of the electrodes in the corresponding array, the value of the susceptance depending on the number of electrodes in the corresponding array, it is possible to construct one or both transducers in such a way that its impedance is substantially real within a range of frequencies which contains the centre-frequency of the frequency response characteristic of the device, thereby eliminating the need for external tuned matching networks. In other words it can be arranged that the motional inductance of one or both transducers substantially exactly tunes out the static capacitance thereof at said centre-frequency.

When the device is to be used to provide front-end selectivity in a radio or other receiver, it will often be required that the impedance of the first transducer at the given frequency be equal to that of free space, i.e. in addition to being real, be substantially equal to 50 ohms. The conductance versus frequency characteristic of each transducer depends on the size of the aperture thereof so, accordingly, the size of the aperture of said first transducer may be such that the impedance of said first transducer is substantially equal to 50 ohms at said given frequency.

Embodiments of the invention will now described, by way of example, with reference to the accompanying diagrammatic drawings, in which:

FIG. 1 shows the known device previously referred to,

FIG. 2 shows the configuration of a first embodiment of the invention,

FIG. 3 shows conductance and susceptance versus frequency characteristics of transducers in the embodiment to be described with reference to FIG. 2, and FIG. 4 shows the configuration of a second embodiment of the invention.

Figure 1:
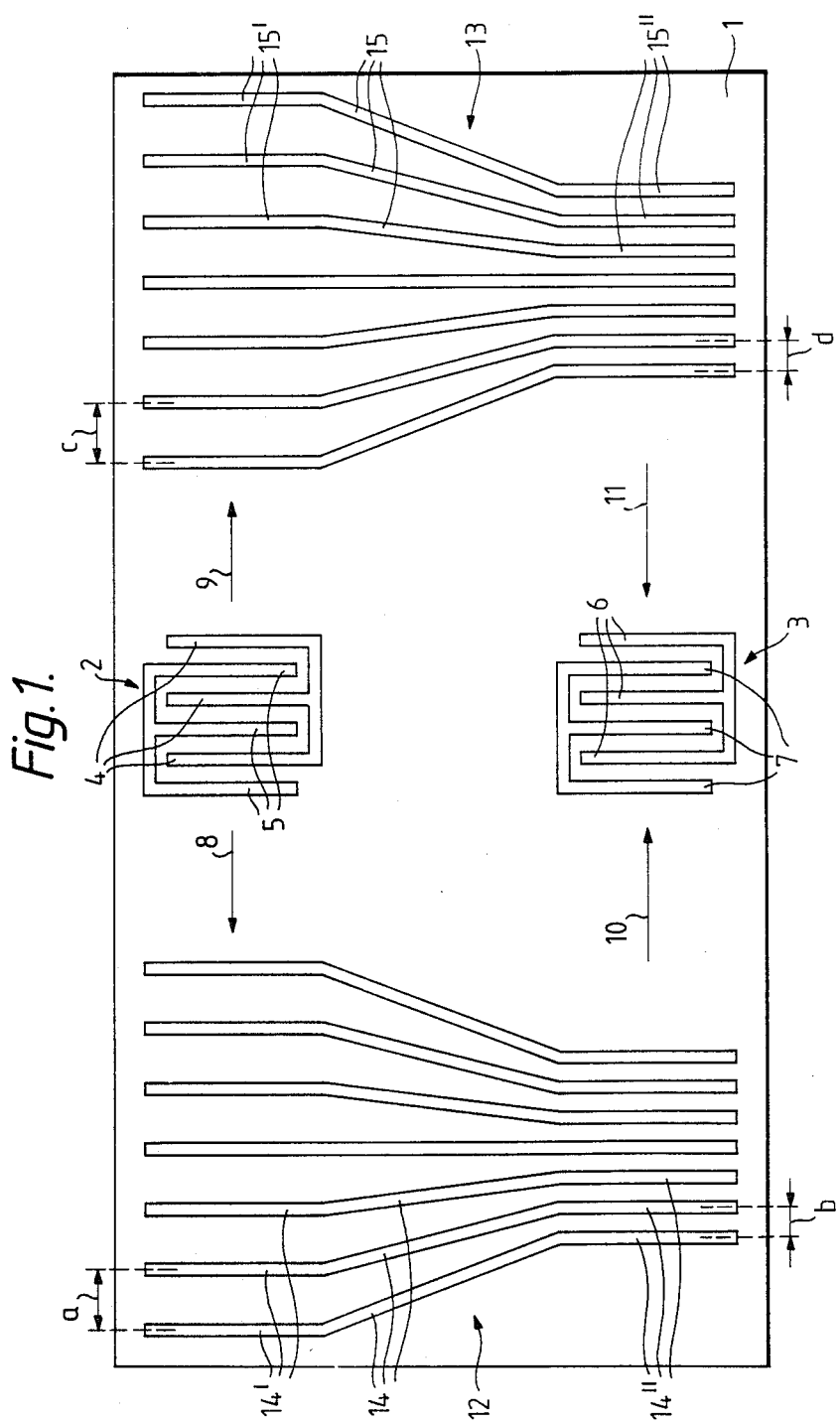

The configuration shown in FIG. 2, in which corresponding components have been given the same references as their counterparts in FIG. 1, is very similar to that shown in FIG. 1, the main difference being that the reflective multistrip couplers are of the kind disclosed in U.S. Pat. Nos. 4,511,867 and 4,519,471 (PHB 32892 and PHB 32893; European patent application 83200986.4), i.e. of the kind in which the centre-to-centre distances of the strips 14 and 15 where they overlay the tracks 8-11 are alternately large (b or d) and small (a or c. Each pair of strips which have a large centre-to-centre distance in one track have a small centre-to-centre distance in the other track. In FIG. 2 a=c=¼λo and b=d=¾λo, where λo is as defined above. Each pair of relatively widely spaced strip portions 14', 14", 15', and 15" has, situated therebetween, a further pair of strips 16 which are connected to a bus-bar 17, 18, 19 or 20. These bus-bars are grounded in operation. Thus there is a regular succession of parallel strips extending along each path 8, 9, 10 and 11, the centre-to-centre distances between adjacent strips in each succession being λo/4 and the strip widths being λo/8. The other difference between the configuration shown in FIG. 2 and that shown in FIG. 1 is that the transducers 2 and 3 are of the double-finger type, pairs of successive electrodes 4, 5, 6 and 7 being connected to the same bus-bar 21, 22, 23 or 24, this bus-bar being different from that to which the adjacent pair is connected. This structure is known from, for example, the paper entitled "Applications of double electrodes in acoustic surface wave device design" by T. W. Bristol et al. presented to the IEEE Ultrasonics Symposium, October 1972. The centre-to-centre distances of the electrodes 4, 5, 6 and 7 are in this case a few percent less than λo/4 (in FIG. 1 they are λo/2) and their widths are a few percent less than λo/8.

FIG. 2 shows, for clarity, only the general configuration of an embodiment of the invention. In the actual embodiment, in which the substrate was 128° Y-rotated X-propagating lithium niobate, the various electrodes and bus bars being formed thereon in known manner by a process of photolithography, transducer 2 included twenty pairs 4,4,5,5 of double fingers (eighty electrodes in all) and transducer 3 similarly included twenty pairs 6,6,7,7 of double fingers. Couplers 12 included 150 electrodes 14 and, similarly, coupler 13 included 150 electrodes 15. This number of electrodes is sufficient to ensure that the reflection coefficient of each coupler is substantially 100% at a frequency corresponding to λo. If a reflection coefficient of 90% is satisfactory in a particular case, the number could be reduced to approximately 100. (Less electrodes would be required with a different lithium niobate cut which is such as to give higher coupling). λo corresponded to approximately 164 MHz. The size of the apertures of transducers 2 and 3 (corresponding to the lengths of the electrodes 4, 5, 6 and 7) was 73 λo.

The susceptance B (normalised to 1/50 ohms) versus frequency f characteristic of each of the transducers 2 and 3 was as shown by curve 25 of FIG. 3, and the conductance G (normalised to 1/50 ohms) of each was as shown by curve 26 of FIG. 3. Thus the impedance of each transducer was substantially real within the range R between approximately 162.5 MHz and 165.5 MHz, i.e. over the band of frequencies within which the couplers 12 and 13 couple substantially all the acoustic surface wave energy incident thereon from their input tracks into their output tracks, the size of which band is approximately 1% of the frequency corresponding to λo for the coupler configuration and substrate material and cut quoted, and was equal to 50 ohms at approximately 164 MHz.

The position along the frequency axis of the minimum in the susceptance curve depends on the centre-to-centre spacing and number of the electrodes of the transducers. For transducers with uniform centre-to-centre spacings of their electrodes this position in general lies some way above their synchronous frequency, moving closer to the synchronous frequency as the number of electrodes is increased. The position of the minimum in the susceptance curve along the susceptance axis depends on several factors. For example it will correspond to a higher value of susceptance, resulting in the susceptance versus frequency characteristic not touching or crossing the axis at all, if the number of electrodes included in the corresponding transducer is decreased, and will correspond to a lower value of susceptance, resulting in the susceptance versus frequency characteristic crossing the axis too steeply, if the number of electrodes included in the corresponding transducer is increased. As another example it depends on whether or not the relevant transducer is apodized. If it is, the number of transducer electrodes required to produce a given value of susceptance at the minimum will in general be larger. As another example it depends on the particular substrate material and particular cut employed. If the material and/or cut are such that the coupling between the substrate and the various electrodes is weaker than in the example quoted, the number of transducer electrodes required to produce a given value of susceptance at the minimum will in general be increased. As yet another example it depends on the mark-to-space ratio of the succession of transducer electrodes. For this reason the actual transducer configuration required to give the desired result in a particular situation will have to be individually calculated. For this purpose reference may be made to the general treatment given in the article entitled "Analysis of generation and detection of surface and bulk acoustic waves by interdigital transducers" by Milsom et al contained in IEEE Transactions on Sonics and Ultrasonics, SU 24, May 1977, pages 147–166, particularly equations (1)–(38) therein. The real part of the impedance of each transducer in general scales inversely with the lengths of its electrodes.

FIG. 4, in which similar components are denoted by the same reference numerals as their counterparts in FIG. 2, shows the general configuration of another embodiment of the invention. Instead of including just one pair of reflective multistrip couplers 12 and 13, this configuration includes three such pairs, 12, 13 and 27, 28 and 29, 30. These couplers are all identical, and identical to the couplers 12 and 13 described with reference to FIG. 2. Moreover the substrate 1 and transducers 2 and 3 are identical to the substrate 1 and transducers 2 and 3 described with reference to FIG. 2. A rectangular layer 31 of acoustic surface wave absorbent material, for example silicone rubber, is provided between the couplers 27 and 28 to prevent cross-talk from occuring at frequencies different from the centre-frequency of the device response.

In all the embodiments described with reference to FIGS. 2 and 4 the reflective multistrip couplers may, as an alternative, have one of the other configurations disclosed in the aforementioned U.S. Pat. Nos. 4,511,867 and 4,510,471 or as shown in FIG. 1 of the accompanying drawings. In particular, the couplers 12 and 13 in FIG. 2 may be modified so that the comparatively large centre-to-centre distances b and d of the strips 14 and 15 are reduced to $2\lambda_0/3$ and the comparatively small centre-to-centre distances a and c are increased to $\lambda_0/3$. Each pair of mutually adjacent strips 16 is replaced by a single strip the centre-line of which is situated midway between the two strips which it replaces, and the width of each strip is increased to $\lambda_0/6$ so that there is now a regular succession of parallel strips extending along each path 8, 9, 10 and 11, the centre-to-centre distances of adjacent strips in each succession being $\lambda_0/3$. If the total number of strips 14, 15, 16 extending along each path 8, 9, 10 and 11 is sufficiently large, for example 300, and the parts of the strips 14 and 15 which interconnect the portions 14' and 14", and 15' and 15", are sufficiently short, for example not more than 10% of the lengths of the portions 14', 14", 15' and 15", such modified couplers need give rise to only a very small energy loss indeed. Similar modifications can be made to the couplers 12, 13 and 27–30 in FIG. 4.

I claim:

1. An acoustic surface wave device comprising a piezo-electric substrate for propagating acoustic surface waves at a surface thereof, a first bi-directional electro-acoustic transducer formed on said surface for launching acoustic surface waves along first and second propagation paths at said surface, a second bidirectional electro-acoustic transducer formed on said surface for receiving acoustic surface waves propagating along said first and second paths at respective input ports thereof, and at least one pair of reflective multi-strip couplers formed on said surface, the two couplers of the or each pair being associated with said first and second paths respectively for receiving acoustic surface wave energy of a given frequency propagating along a portion of the associated path and relaunching at least part of that energy as acoustic surface waves along another portion of the associated path, said given frequency being the same for each coupler, each transducer comprising an interdigital array of electrodes which extend at right angles to the length directions of the propagation paths where those paths adjoin the relevant tranducer, characterized in that the number of electrodes and centre-to-centre distances of the electrodes in at least one said transducer interdigital array are such that the susceptance versus frequency characteristic of the corresponding transducer exhibits a minimum which substantially coincides with said given frequency and the value of the susceptance at this minimum is substantially zero.

2. A device as claimed in claim 1, wherein the size of the aperture of said first transducer is such that the impedance of said first transducer is substantially 50 ohms at said given frequency.

3. An acoustic surface wave device as claimed in claim 1 wherein the number of electrodes and the center-to-center spacings thereof in said corresponding transducer are arranged so that the impednace of the corresponding transducer is substantially real over a band of frequencies which includes said given frequency, said given frequency being the center frequency of the device frequency response characteristics and which is mainly determined by the multistrip couplers.

4. An acoustic surface wave device comprising a piezoelectric substrate for propagating acoustic surface waves at a surface thereof, a first bidirectional electro-acoustic transducer disposed on said surface for launching acoustic surface waves along first and second propagation paths at said surface, a second bidirectional electro-acoustic transducer disposed on said surface for receiving acoustic surface waves propagating along said first and second paths at respective input ports thereof, and at least one pair of reflective multi-strip couplers disposed on said surface and associated with said first and second paths respectively for receiving acoustic surface wave energy of a given frequency propagating along a portion of the associated path and relaunching at least part of that energy as acoustic surface waves along another portion of the associated path, said given frequency being the same for each coupler, each transducer comprising an interdigital array of electrodes which extend at right angles to the directions of the propagation paths where those paths adjoin the relevant transducer, the number of electrodes and the center-to-center spacings of the array of electrodes of at least one of the transducers being chosen so that the impedance of that transducer is substantially real over a range of frequencies which contains the center frequency of the device frequency response characteristic as determined by the multi-strip couplers, the number of electrodes and the center-to-center spacings of the array of electrodes in at least one of the transducers being chosen so that the susceptance versus frequency characteristic of the corresponding transducer exhibits a minimum which substantially coincides with said given frequency and the value of the susceptance at this minimum is substantially zero.

5. A device as claimed in claim 4 wherein the first and second transducers are located adjacent one another in parallel but non-aligned non-overlapping acoustic surface wave propagation tracks on the piezoelectric substrate, and the multi-strip couplers are located on opposite sides of said transducers.

6. A device as claimed in claim 4 wherein the array of electrodes of at least one transducer comprises alternating pairs of electrodes in interdigitated relationship to define a split electrode transducer.

7. A device as claimed in claim 4 wherein each multi-strip coupler includes further pairs of interdigitated reflective strips connected to respective grounded busbars on said piezoelectric substrate.

* * * * *